United States Patent [19]

Kaji et al.

[11] Patent Number: 4,980,017

[45] Date of Patent: Dec. 25, 1990

[54] METHOD FOR RECIRCULATING HIGH-TEMPERATURE ETCHING SOLUTION

[75] Inventors: Toshimitsu Kaji, Meguro; Tadao Takeuchi, Chiba; Tsutomu Kawashima, Koto; Eiichi Miyakoshi, Kasukabe; Yasukatsu Nishikata, Funabashi; Yasuya Hisatome, Kawasaki, all of Japan

[73] Assignee: Nisso Engineering Company, Ltd., Tokyo, Japan

[21] Appl. No.: 412,444

[22] Filed: Sep. 26, 1989

[30] Foreign Application Priority Data

Oct. 1, 1988 [JP] Japan .................. 63-248757

[51] Int. Cl.$^5$ .............................. C23F 1/00
[52] U.S. Cl. .................. 156/642; 156/662; 134/108; 137/3; 137/88
[58] Field of Search ............ 137/563, 2, 88, 3; 134/108, 2, 99; 437/225, 228; 156/662, 642

[56] References Cited

U.S. PATENT DOCUMENTS

| | | | |
|---|---|---|---|
| 4,017,343 | 4/1977 | Haas | 156/642 |
| 4,479,849 | 10/1984 | Frantzen | 156/642 X |
| 4,710,261 | 12/1987 | Dennis | 156/642 X |
| 4,795,497 | 1/1989 | McConnell | 134/99 X |

FOREIGN PATENT DOCUMENTS

| | | |
|---|---|---|
| 60-71012 | 4/1985 | Japan . |
| 61-54217 | 3/1986 | Japan . |
| 0639124 | 1/1988 | Japan . |
| 63-28417 | 2/1988 | Japan . |

Primary Examiner—Alan Cohan
Attorney, Agent, or Firm—Oblon, Spivak, McClelland, Maier and Neustadt

[57] ABSTRACT

A method for recirculating a high-temperature etching solution according to the present invention comprises the steps of continuously removing, from a bath for etching a wafer for a semiconductor device, a portion of an etching solution contained in the etching bath, injecting a predetermined amount of pure water for adjusting the concentration of the etching solution into the removed etching solution, heating the resulting solution to a predetermined temperature, and recirculating the heated solution into the etching bath.

4 Claims, 2 Drawing Sheets

METHOD FOR RECIRCULATING HIGH-TEMPERATURE ETCHING SOLUTION

BACKGROUND OF THE INVENTION

1. Field of the Invention

The present invention relates to a method for recirculating a high-temperature etching solution, particularly for use in a precise wet etching of a wafer for a semiconductor device.

2. Discussion of Background

In a semiconductor field, recently, with increases in performance and integration of a semiconductor device, it has been required to provide a satisfactory precise etching of a film of silicon oxide (which will be referred to as a film of $SiO_2$ hereinafter) and a film of silicon nitride (which will be referred to as a film of $Si_4N_3$ hereinafter) as in LSIs of so-called MNOS and CMOS types.

In such etching, a reduction in thickness of a gate insulating film is an important point. There is a need of a precise etching treatment in which only the film of $Si_4N_3$ of the films of $SiO_2$ and $Si_4N_3$ formed on a silicon substrate is uniformly etched as much as possible, while leaving the film of $SiO_2$.

With a semiconductor device of 64 K bits, the film of $SiO_2$ may be relatively thick (e.g., 2,000 Å). With a semiconductor device of 1 M bit, however, the thickness of the film of $SiO_2$ is decreased (e.g., 1,000 Å) and hence, if the film of $Si_4N_3$ is intended to be etched to a thinner level, e.g., by 200 Å, even the film of $SiO_2$ may be etched inevitably.

When the etching cannot be uniformly conducted, or when the concentration and/or temperature of the etching solution are or is higher, there is a problem of a ratio of the etched amount of the film of $Si_4N_3$ to the etched amount of the film of $SiO_2$, i.e, a selection ratio.

In general, a phosphoric acid solution is used as an etching solution for these films. However, if the temperature of this phosphoric acid is raised, the etched amount may be increased, and with a variation in temperature of the phosphoric acid solution, the selection ratio may be also varied.

Such a relationship is as illustrated in FIG. 2.

Therefore, it is necessary to properly select conditions such as the temperature and concentration of the etching solution, the etched amount and the selection ratio depending upon the type of intended semiconductor device, and a wider range of such selection are desired.

To meet such demands, it is a conventional practice to employ an etching method using an apparatus shown in FIG. 3.

FIG. 3 illustrates one example of apparatus used to carry out a conventional method for etching a film of $Si_4N_3$ on a wafer having films of $SiO_2$ and $Si_4N_3$ on a silicon substrate by use of a high-temperature phosphoric acid solution as an etching solution.

In this conventional method, a wafer 18 held by a wafer holder 19 is immersed into an etching solution 1 consisting of a phosphoric solution having a high temperature of 150° C. to 180° C. and contained in an etching bath 2 having a primary heater 7, and the wafer holder is supported externally through a hole in a lid 20. An $N_2$ gas inlet pipe 22 is mounted at a bottom of the etching bath 2. An $N_2$ gas is injected through the inlet pipe 22 and bubbled through the solution to stir the latter, while at the same time, manually swinging the wafer holder 19, thus performing the etching.

Water in the phosphoric acid solution is evaporated by heating, resulting in an increased concentration of the solution and hence, in order to maintain the concentration thereof constant, pure water as a replenishing water may be manually intermittently added or continuously dropped through a pipe 21.

The adjustment of the temperature of the etching solution 1 is conducted by a temperature controller 15.

In this method, if the etching ability is reduced while the etching is being repeated, the batch of such etching is completed, and the solution in the bath is discarded. Then, a new phosphoric acid solution adjusted in concentration is placed into the bath to start the subsequent batch of etching.

In the above conventional etching method, however, it is difficult to satisfactorily control the etching for excellent uniformity and selectivity when a presice etching is required.

More specifically, in this method, because the replenishing water is manually added directly into the etching bath in order to keep the concentration of the phosphoric acid solution constant, it is difficult to maintain the solution concentration in a very narrow given range, even if the etching solution is stirred by bubbling the N2 gas while swinging the wafer holder.

For example, when the replenishing water is added, the concentration and the temperature are dropped in an initial state of addition and then gradually raised On the other hand, when the addition is performed by dropping, the water at a local place at which the replenishing water has been dropped is boiled to cause a reduction in temperature at such place, resulting in nonuniform concentration and temperature in the etching bath to produce an unevenness in etching on the surface of the wafer.

Another problem in this method is that there is a fear of a mechanical trouble resulting in a complicated operation, such as a foreign matter produced due to &he contact of the wafer holder with a peripheral edge of the hole in the lid because the wafer holder is manually swung.

In addition, the stirring by bubbling of the N2 gas is accompanied by the following disadvantages: Frequently, the bubbles of N2 gas may be deposited onto or stagnated on the surface of the wafer, causing the etching thereat to be locally delayed. Moreover, the supplying of the N2 gas may increase the chance of inclusion of a foregin matter, and the N2 gas is discharged out of the etching bath and then exhausted outside the system, resulting in a uselessness thereof to cause an uneconomy.

Therefore, with the conventional method, it is difficult to provide the precise etchability for very thin films of $SiO_2$ and $Si_4N_3$, resulting in a lower yield of products. Further, it is impossible to increase the etching temperature and concentration and for this reason, the life of the etching solution may be shortened and consequently, the frequency of replacement of the etching solution may be, of course, increased, leading to a lower productivity.

SUMMARY OF THE INVENTION

It is an object of the present invention to provide an improvement in a method for recirculating a high-temperature etching solution, wherein the precise etchability for a very thin film as well as the yield and productivity is improved.

To achieve the above object, according to the present invention, there is provided a method for recirculating a high-temperature etching solution, comprising the steps of continuously removing, from an etching bath in which a wafer for a semiconductor device is etched, a portion of the etching solution contained in the etching bath, injecting a predetermined amount of pure water for adjusting the concentration of the etching solution to the removed etching solution, heating the resulting etching solution, and recirculating the latter into the etching bath.

With the method of the present invention, even when the films of $SiO_2$ and $Si_4N_3$ formed on a silicon substrate are precisely etched, it is possible to perform an etching with a smaller and uniform etching deviation and with a large selection ratio.

Therefore, in the method of the present invention, it is possible to select conditions such as the etching temperature and the concentration within a wider range, thereby producing a high-performance semiconductor device with a good yield.

The etching solution used in the present invention is preferably a solution permitting the etching at near its boiling point, such as a phosphoric acid solution used for etching films of $SiO2$ and $Si4N3$ formed on a silicon substrate.

In this case, a particularly preferred etching condition can be obtained.

A specified recirculating manner in the present invention is to cause the high-temperature etching solution to overflow through an overflow weir for removal and to recirculate the etching solution through a distributing plate mounted at a bottom in the etching bath.

In this case, the etching solution recirculated is a vertical flow which rises uniformly along the surface of a silicon wafer.

Further, in the method of the present invention, pure water for adjusting the concentration of the etching solution may be injected into an etching solution recirculating pipe by use of a water injecting device including a flowmeter having an automatic valve.

In this case, a replenishing water can be automatically supplied to keep the concentration constant.

The above and other objects, features and advantages of the invention will be readily understood from a reading of the following description of the preferred embodiment, taken in conjunction with the accompanied drawings.

DESCRIPTION OF THE PREFERRED EMBODIMENT

Figure 1:
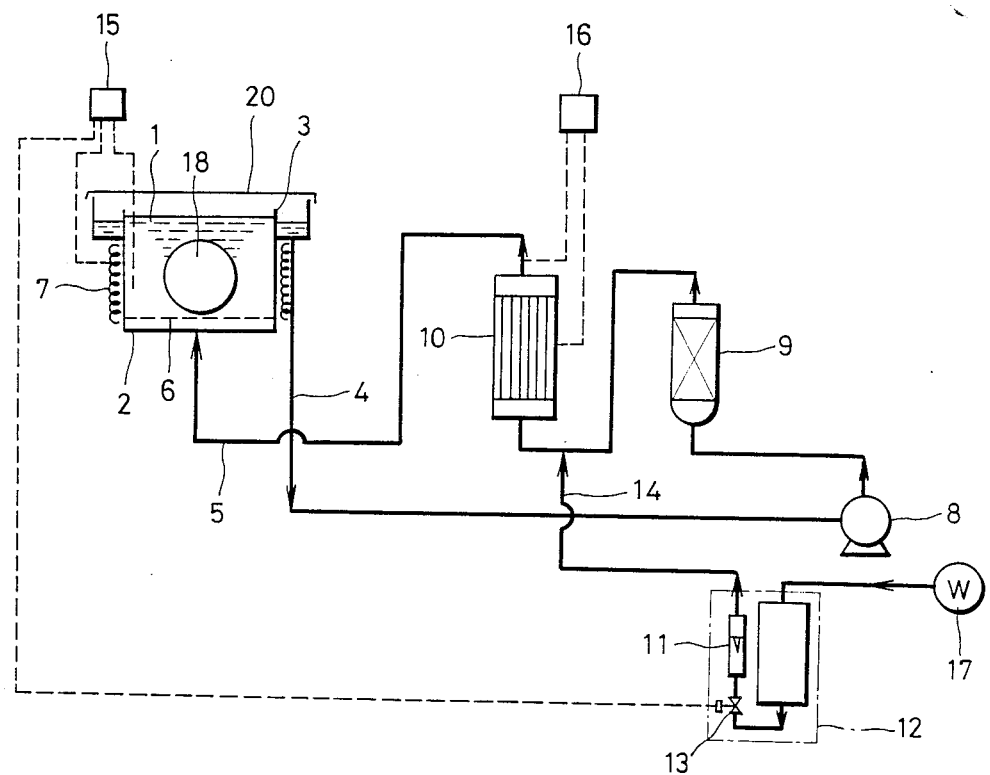
FIG. 1 is an arrangement diagram illustrating one embodiment of an apparatus in which a method for recirculating an etching solution according to the present invention is carried out.

Referring to FIG. 1, there is shown an etching apparatus for carrying out a method for recirculating a high-temperature etching solution according to the present invention.

The etching apparatus shown in FIG. 1 comprises an etching bath 2 filled with an etching solution 1, an overflow weir 3 mounted at an upper peripheral edge of the etching bath 2, a takeoff pipe 4 connected to a bottom of the overflow weir 3, a distributing plate 6 mounted within the etching bath 2, a return pipe 5 connected to a bottom of the etching bath 2, and a primary heater 7 mounted around an outer periphery of the etching bath 2.

The distributing plate 6 is provided with a large number of perforations and mounted on an inside bottom surface of the etching bath 2 in an opposed relation to the return pipe 5.

The takeoff pipe 4 is connected to the return pipe 5 through a pump 8, a filter 9 and a secondary heater 10.

The etching apparatus also includes a water injecting device 12, and temperature controllers 15 and 16.

The water injecting device 12 includes a flowmeter 11 having a solenoid valve 13, and is connected between the filter 9 and the secondary heater 10 by a water injecting pipe 14.

The temperature controller 15 serves to detect the temperature of the etching solution 1 in the etching bath 2 and also to control the driving of the water injecting device 12, so that the temperature of the primary heater 7 may be controlled on the basis of the detection result, and the driving of the water injecting device may be controlled on the basis of the detected temperature.

The temperature controller 16 serves to detect the heated temperature of the etching solution of the return pipe 5 in the vicinity of an outlet thereinto from the secondary heater 10, so that the hating temperature of the secondary heater 10 may be controlled on the basis of the detection result.

The above-described apparatus, device and piping are, of course, made using a material sufficiently rich in corrosion resistance and durability, such as a fluorocarbon resin and a polypropylene, because an acid having a high temperature and a high concentration is used as an etching solution and also because a high purity semiconductor is intended to be produced.

Description will be made of a specified etching method using the above apparatus.

A 85% aqueous solution of phosphoric acid as an etching solution is placed into the etching bath 2 and heated to an interior temperature of 158° C. by the primary heater 7, so that a boiling state is maintained.

Then, the etching solution 1 overflowing through the overflow weir 3 is withdrawn into the takeoff pipe 4 by the pump 8. The foreign matter is removed by the filter 9 and then, the resulting solution is recirculated to the bottom of the etching bath 2 through the seconadry heater 10 and the return pipe 5.

During this time, the adjustment of the temperature within the etching bath 2 to maintain it at 158° C. is performed by the ON/OFF switching operation of the primary heater 7 on the basis of the detection of the temperature by the temperature controller 15.

The water injecting device 12 is driven on the basis of the temperature detected by the temperature controller 15, so that the replenishing pure water 17 is supplied to a pipe leading to the secondary heater 10 through a water injecting pipe 14, while controlling the opening and closing of the solenoid valve 13 on the basis of the results of detection by the flowmeter 11.

The amount of pure water supplied is controlled on the basis of a difference between the result of detection of the temperature and a preset boiling temperature, and corresponds to the amount of water evaporated in the etching bath 2.

In this manner, the concentration and the temperature within the etching bath 2 are each constantly maintained within a given range, permitting the boiling state to be maintained in a predetermined range.

When the recirculating system is stabilized by the above controlling operation, a wafer 18 supported by a wafer holder (not shown) is immersed, with its surface to be etched being vertical, into the etching solution in the etching bath 2, thus achieving the etching.

When the solution adjusted in concentration and temperature near to those of the etching solution 1 within the etching bath 2 is supplied into the bottom of the etching bath through the return pipe 5, the pressure of such solution is released, and the water contained therein is rapidly evaporated to generate a large number of bubbles which uniformly rises from the entire bottom surface of the etching bath 2 through the distributing plate 6 to stir the entire etching solution, thereby satisfactorily uniforming the concentration and the temperature.

Figure 2:
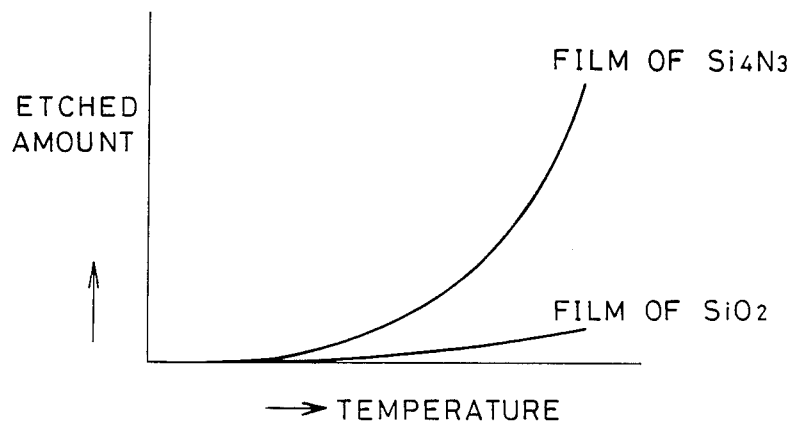
FIG. 2 is a characteristic graph illustrating a relationship between the etched amount and the etching time for films of silicon oxide and silicon nitride.
Figure 3:
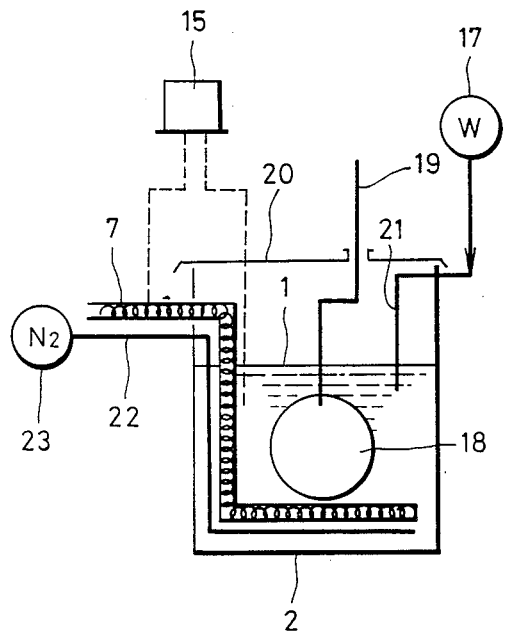
FIG. 3 is an arrangement diagram illustrating an apparatus in which a conventional method for recirculating a high-temperature etching solution is carried out.

The concentration and the temperature of the etching phosphoric acid solution 1 within the etching bath 2 are selected according to the etching conditions based on a characteristic as shown in FIG. 2.

For example, if the concentration is of 85%, the etching solution is brought into a substantially boiling state at a temperature of 1582 C. If the concentration is of 90%, the solution is brought into a substantially boiling state at a temperature of 175° C.

It should be noted that the above relationship is a substantial aim, because the aqueous solution of phosphoric acid itself with a high concentration is subject to a phase change therein, and when such phosphoric acid solution is used as an etching solution, it is subject to a thermal effect and an influence due to a variation with time.

Therefore, it is not that the temperature of the etching solution must be a boiling temperature depending upon the concentration of the phosphoric acid; and actually, a sufficient amount of bubbles can be provided by maintaining the temperature of the etching solution at near its boiling point.

The results of etching of the silicon wafers obtained by the above method will be described below with reference to Tables 1 and 2.

The etching conditions are as follows:

*Wafer—a wafer having a film of $SiO_2$ of about 1,000 Å and a film of $Si_4N_3$ is about 1,500 Å formed on a silicon substrate having a diameter of 6 inches.

*Etching conditions—Such wafers 1 to 4 were vertically immersed into a phosphoric acid solution within the etching bath at four places an etched for 20 minutes under treating conditions of a concentration of 85% and a temperature of 158° C. of the phosphoric acid solution.

TABLE 1

| Etching | Film of $Si_4N_3$, thickness Å | | | | |
|---|---|---|---|---|---|
| | 1 | 2 | 3 | 4 | Average |
| Before etching | 1,508 | 1,498 | 1,490 | 1,512 | 1,502 |
| After etching | 390 | 375 | 358 | 399 | 381 |
| Etched amount | 1,118 | 1,123 | 1,132 | 1,113 | 1,121 |

TABLE 1-continued

| Etching | Film of $Si_4N_3$, thickness Å | | | | |
|---|---|---|---|---|---|
| | 1 | 2 | 3 | 4 | Average |

Etching rate $= \frac{1,121 \text{ Å}}{20 \text{ min.}} = 56.1$ Å/min.

Etching deviation $= \frac{1,132 \text{ Å} - 1,113 \text{ Å}}{1,121 \text{ Å}} \times 100 = 1.7\%$ (Deviation of ± 0.85%)

TABLE 2

| Etching | Film of $SiO_2$, thickness Å | | | | |
|---|---|---|---|---|---|
| | 1 | 2 | 3 | 4 | Average |
| Before etching | 1,003 | 992 | 987 | 1,009 | 998 |
| After etching | 980 | 974 | 965 | 985 | 976 |
| Etched amount | 23 | 18 | 22 | 24 | 22 |

Etching rate $= \frac{22 \text{ Å}}{20 \text{ min.}} = 1.1$ Å/min.

Etching deviation $= \frac{24 \text{ Å} - 18 \text{ Å}}{22 \text{ Å}} \times 100 = 27.3\%$ (Deviation of ± 13.7%)

Selection Ratio $Si_4N_3$ film etching rate/$SiO_2$ film etching rate = 56.1/1.1 = 51/1

As apparent from the above Tables 1 and 2, the etching selection ratio is of 51 (the $Si_4N_3$ film) to 1 (the $SiO_2$ film) and the etching deviation is smaller. This suggests that a good etching control could be achieved.

This is attributable to the following reason.

A predetermined amount of pure water 17 is injected into the etching solution to be recirculated into the etching bath 2, and the resulting solution is heated to a predetermined temperature by the secondary heater 10. Therefore, the concentration and temperature distribution of the etching solution 1 within the etching bath 2 can be always kept constant.

When the etching solution 1 is, for example, an aqueous solution of phosphoric acid wherein the etching is conducted at near its boiling point, and as the etching solution with the pure water 17 injected thereinto has been returned into the etching bath, the pressure thereof is released, causing bubbles of water vapor to be rapidly generated to voilently stir the etching solution. Thus, the bubbles of water vapor cannot be deposited onto and stagnated on the surface of the wafers 18 and prevents the generation of an etching unevenness by a stirring effect.

This effect can effectively prevent the generation of an etching unevenness, because the recirculation of the etching solution with the pure water injected thereinto through the distributing plate 6 mounted at the bottom of the etching bath 2 causes the bubbles of water vapor to rise from the bottom of the etching bath 2, thereby allowing the etching solution to flow vertically and in parallel in the form of an upward flow between the wafers 18 without stagnation to provide a uniform stirring.

This stirring also causes the foreign matter within the etching bath 2 to rise to the surface and thus to be removed efficiently through the overflow weir 3. Therefore, it is more difficult for the foreign matter to be deposited onto the wafers.

Further, when the water injecting device 12 including the flowmeter 11 having the automatic valve 13 is employed, the replenishing water can be automatically supplied and hence, a troublesome labors such as adjustment of the concentration can be omitted and yet, the concentration can be maintained in a given range.

As discussed above, according to the present invention, when the films of $SiO_2$ and $Si_4N_3$ formed on the silicon substrate are etched in a precise manner, it is possible to provide a uniform etching with a smaller etching deviation and à larger selectivity.

Accordingly, in the method of the present invention, it is possible to select the conditions in a wider range such as the etching temperature and the concentration, thereby producing a high-performance semiconductor with a good yield. In addition, as compared with the prior art method, the life of the etching solution can be prolonged, and the frequency of replacement of the etching solution can be reduced, leading to an improvement in productivity.

Although the replenishing water has been injected between the filter 9 and the secondary heater 10 in the above embodiment, it will be understood that such water may be supplied between the pump 8 and the filter 9, or between a pipe downstream the secondary heater 10 without substantial problems, depending upon the etching conditions.

In addition, although the aqueous solution of phosphoric acid has been used as an etching solution in the above embodiment, acids and other etching solutions where the etching is performed at near their boiling points can be likewisely used. Further, it is of course that the film to be etched is not limited to the films of $SiO_2$ and $Si_4N_3$.

While the preferred embodiment of the present invention has been described, it will be understood that the present invention is not limited thereto, and includes modifications and variations which can be made by those skilled in the art without departing from the spirit and scope of the invention.

What is claimed is:

1. A method for recirculating a high-temperature etching solution, comprising the steps of:

continuously removing, from an etching bath in which a wafer for a semiconductor device is etched, a portion of an etching solution contained in the etching bath;

detecting a temperature of said bath;

injecting a predetermined amount of pure water for adjusting the concentration of the etching solution into the removed etching solution in response to said detected temperature, said predetermined amount being selected as a function of a difference between the detected etching bath temperature and a preset boiling temperature, wherein the amount of water injected corresponds to said temperature difference;

heating the resulting solution to a predetermined temperature and recirculating the heated solution into the etching bath.

2. A method for recirculating a high temperature etching solution according to claim 1, wherein said etching solution is a solution such as an aqueous solution of phosphoric acid where the etching is conducted at near its boiling point.

3. A method for recirculating a high-temperature etching solution according to claim 1, wherein said etching bath comprises an overflow weir mounted at an upper portion, and a distributing plate mounted at a bottom within the etching bath, so that the etching solution contained in said etching bath is caused to overflow through said overflow weir and removed, and the etching solution removed and adjusted in concentration is recirculated into said etching bath through said dIstributing plate.

4. A method for recirculating a high-temperature etching solution according to claim 1, wherein the pure water for adjusting the concentration of said etching solution is injected into the etching solution removed from the etching bath by use of a water injecting device including a flowmeter having an automatic valve.

* * * * *